(12) United States Patent
Matsunaga

(10) Patent No.: US 8,190,413 B2
(45) Date of Patent: May 29, 2012

(54) METHOD FOR SIMULATING PERFORMANCE OF GOLF CLUB HEAD

(75) Inventor: Hideo Matsunaga, Tokyo (JP)

(73) Assignee: Bridgestone Sports Co., Ltd, Tokyo (JP)

( * ) Notice: Subject to any disclaimer, the term of this patent is extended or adjusted under 35 U.S.C. 154(b) by 328 days.

(21) Appl. No.: 11/313,928

(22) Filed: Dec. 22, 2005

(65) Prior Publication Data
US 2006/0160637 A1 Jul. 20, 2006

(30) Foreign Application Priority Data
Dec. 28, 2004 (JP) ................ P2004-379320

(51) Int. Cl.
*G06G 7/48* (2006.01)
(52) U.S. Cl. .......................................... 703/7
(58) Field of Classification Search .......... 473/324–350; 345/423
See application file for complete search history.

(56) References Cited

U.S. PATENT DOCUMENTS

| 5,481,465 | A | * | 1/1996 | Itoh et al. ............... 700/118 |
| 5,488,692 | A | * | 1/1996 | Karasick et al. ......... 345/420 |
| 5,731,817 | A | * | 3/1998 | Hahs et al. .............. 345/423 |
| 5,877,970 | A | * | 3/1999 | Nesbit et al. ............... 703/1 |
| 6,648,769 | B2 | * | 11/2003 | Lee et al. ................ 473/223 |
| 6,876,956 | B1 | * | 4/2005 | Cirak et al. ............... 703/2 |
| 6,983,637 | B2 | * | 1/2006 | Nesbit et al. ........... 73/12.02 |
| 7,223,179 | B2 | * | 5/2007 | Tsunoda ................. 473/324 |
| 2004/0162158 | A1 | | 8/2004 | Tsunoda | |

FOREIGN PATENT DOCUMENTS

| JP | 3-210671 A | 9/1991 |
| JP | 2002-207777 A | 7/2002 |
| JP | 2004-242875 A | 9/2004 |
| JP | 2004-267765 A | 9/2004 |
| JP | 2005-65996 A | 3/2005 |

OTHER PUBLICATIONS

"What are shell elements and why should I use them?", Graphics Systems SolidNotes. dated Jan. 23, 2007.*
Decision of Refusal issued Aug. 3, 2010, in counterpart Japanese Application No. 2004-379320.
Notification of Reason for Refusal issued May 18, 2010 in counterpart Japanese Application No. 2004-379320.
Notification of Reasons for Refusal issued Feb. 23, 2010 in counterpart Japanese Application No. 2004-379320.

* cited by examiner

*Primary Examiner* — Alvin Hunter
(74) *Attorney, Agent, or Firm* — Sughrue Mion, PLLC

(57) ABSTRACT

A method for simulating performance of a golf club head includes dividing a model of the golf club head of a hollow structure using shell elements, and arranging the shell elements on a surface of the model of the golf club head.

20 Claims, 4 Drawing Sheets

METHOD FOR SIMULATING PERFORMANCE OF GOLF CLUB HEAD

This application is based upon and claims the benefit of priority from the prior Japanese Patent Application No. 2004-379320 filed on Dec. 28, 2004, the entire contents of which are incorporated herein by reference.

BACKGROUND OF THE INVENTION

1. Field of the Invention

The invention relates to a method for simulating performance of a golf club head, and more particularly to a method for simulating performance of a golf club head, which is suitable for analyzing the performance of the golf club head using the finite element method (FEM).

2. Description of the Related Art

Recently, in designing golf clubs, various types of performances of golf club heads are simulated using to use a general-purpose computer.

For example, US 20040162158 A discloses designing golf club heads and golf balls using the finite element method by applying finite element models as golf club head models and golf ball models. Specifically, the thickness, material, weight and shape of golf club heads and golf balls are changed by changing input data for elements constituting respective models. Various types of golf club head models and golf ball models are prepared on computers to simulate various types of performances thereof on the computers.

In the finite element method analysis, shell elements and solid elements have been used as finite elements in many cases. In a case of shell elements, which constitute one of the two types of elements used, are applied, when shell elements are applied to thick portions of a golf club head, shell elements are generally set on neutral planes of the thick portions.

SUMMARY OF THE INVENTION

However, it has been difficult to set the shell element on recent club head models, which have faces and bodies part of which is different in thickness from the other part. This is because since the position of the shell element on the neutral plane has to be changed depending on models having different thicknesses, the number of position settings of shell elements on neutral planes is increased remarkably, which leads to drawback that calculation time for a simulation becomes long.

In addition, in a case where the thickness of a model varies, while solid elements are often used as the finite element, the number of finite elements increases inevitably, which leads to drawback that calculation time for a simulation becomes longer as the number of finite elements increases. Furthermore, in the case of the solid element, there arises a problem that the simulation accuracy gets worse in comparison with the shell element.

The invention was made in view of these problems and provides a method for simulating performance of a golf club head, which can obtain calculation results with high accuracy within a short calculation time by utilizing an optimal modeling method in finite element modeling when attempting to perform a simulation analysis on a golf club head using the finite element method.

According to a first aspect of the invention, a method simulates performance of a golf club head. The method includes dividing a model of the golf club head of a hollow structure using shell elements as finite elements; and arranging the shell elements on a surface of the model of the golf club head.

Since the shell elements are used as the finite elements, the number of finite elements, which form a model, is reduced. Furthermore, since the shell elements are arranged on the surface of the model of the golf club head, the accuracy of simulation can be increased greatly.

According to a second aspect of the invention, the dividing of the golf club head may include: applying four-node shell elements to most part of the model; and applying to the remaining part of the model at least one selected from a group consisting of three-node shell elements, the four-node solid elements, eight-node solid elements, beam elements and concentrated mass elements.

Since the shell elements and the other elements are combined appropriately as required, a simulation result with better accuracy can be obtained.

According to a third aspect of the invention, vector directions of the shell elements may be identical to each other Accordingly, a simulation result with much better accuracy can be realized.

According to a fourth aspect of the invention, a shape of the model to which the shell elements are applied may be identical to a contour shape of an object to be obtained.

According to this configuration, a simulation can be implemented, which appropriately matches the contour of the golf club head.

According to the method for simulating performance of a golf club head set forth above, when a simulation analysis is carried out on a golf club head using the finite element method, since the optimal modeling method in modeling finite elements is used, it is possible to obtain calculation results with high accuracy within a short calculation time.

DETAILED DESCRIPTION OF EMBODIMENTS OF THE INVENTION

Referring to FIGS. 1 to 4, embodiments of the invention will be described below.

Firstly, a method for simulating performance of a golf club heads according to this embodiment of the invention will briefly be described.

Figure 1:
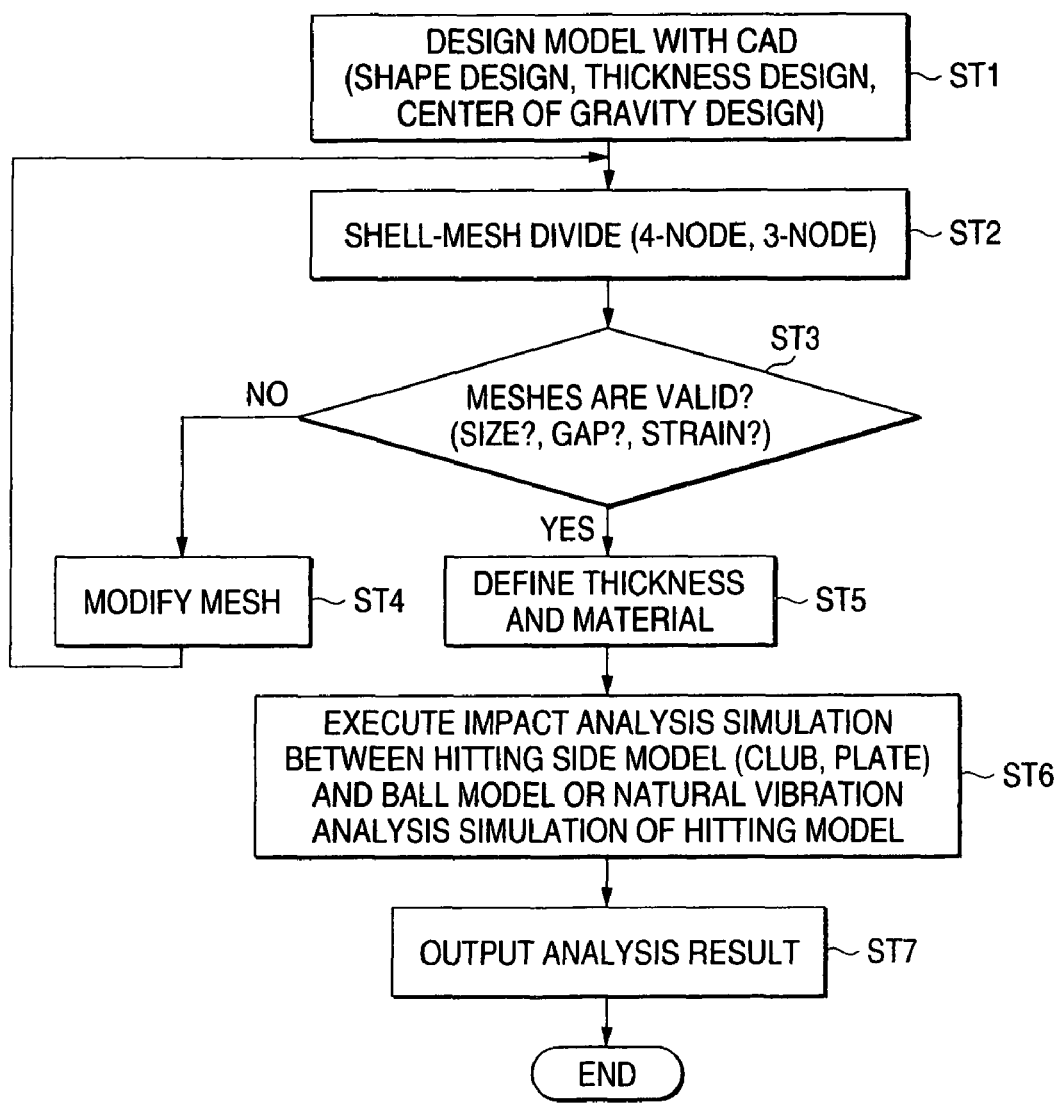
FIG. 1 shows a flowchart illustrating a modeling according to one embodiment of the invention and a subsequent analysis.

FIG. 1 shows a flowchart, which illustrates modeling of a golf club head in accordance with a finite element method of this embodiment and a subsequent analysis.

In modeling a golf club head in accordance with the finite element method, as shown in step $ST_1$, a model of the golf club head is designed using a three-dimensional CAD. In this model design, the shape, thickness and center of gravity of the golf club head are designed.

In the following step ST2, a golf club head designed in the previous step ST1 is shell-mesh divided in accordance with the finite element method. A four-node shell element or a three-node shell element is applied to each of the divided models. In this case, each shell element is arranged not on a neutral plane of a wall but on a surface of a wall (hereinafter, referred to as an "offset"). Furthermore, in this case, PATRAN (from MSC Co., Ltd.) may be used as a mesh preparing software.

In the following step ST3, the validity of the size, gap, strain and the like of a shell prepared in step ST2 is examined. If the validity is denied, then the flow proceeds to step ST4 to modify the mesh and thereafter returns to step ST2.

The mesh modification is executed continuously in step ST4 until a result of the determination made in step S3 is valid in step ST3. Then, the flow proceeds to step ST5 when the result of the determination is valid in step S3.

In step ST5, the thickness and material conditions (for example, density, Young's modulus, Poisson ratio and the like) of the respective divided models are defined.

In the following step ST6, an impact analysis simulation between a club head or a plate, which serves as a hitting side model, and a ball model or a natural vibration analysis simulation of the hitting side model is executed. In this case, LS-DYNA (Livermore Software Technology Corporation (LSTC)) may be used as an impact analysis simulation software and ABAQUS (ABAQUS, Inc.) as a natural vibration analysis simulation software.

In the following step ST7, analysis results are output to examine the results of the simulation, and the flow ends.

Figure 2:
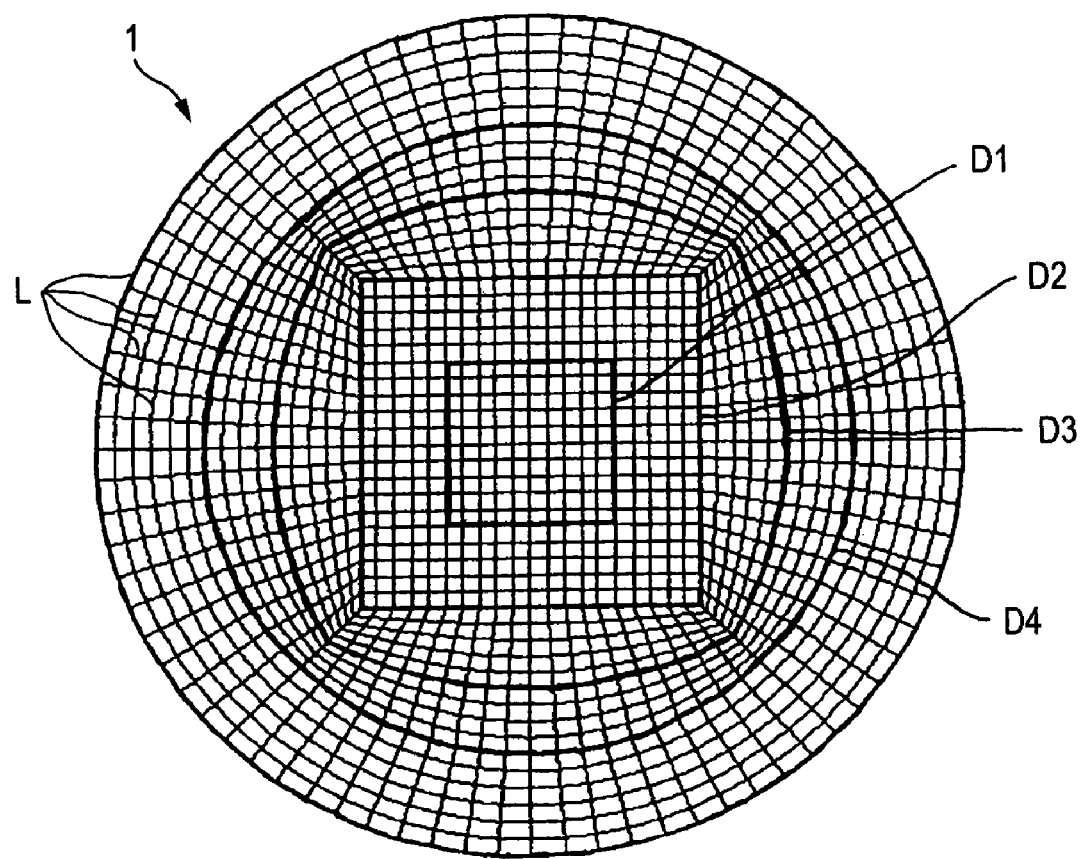
FIG. 2 shows a front view of a plate model, which serves as a hitting side model.
Figure 3:
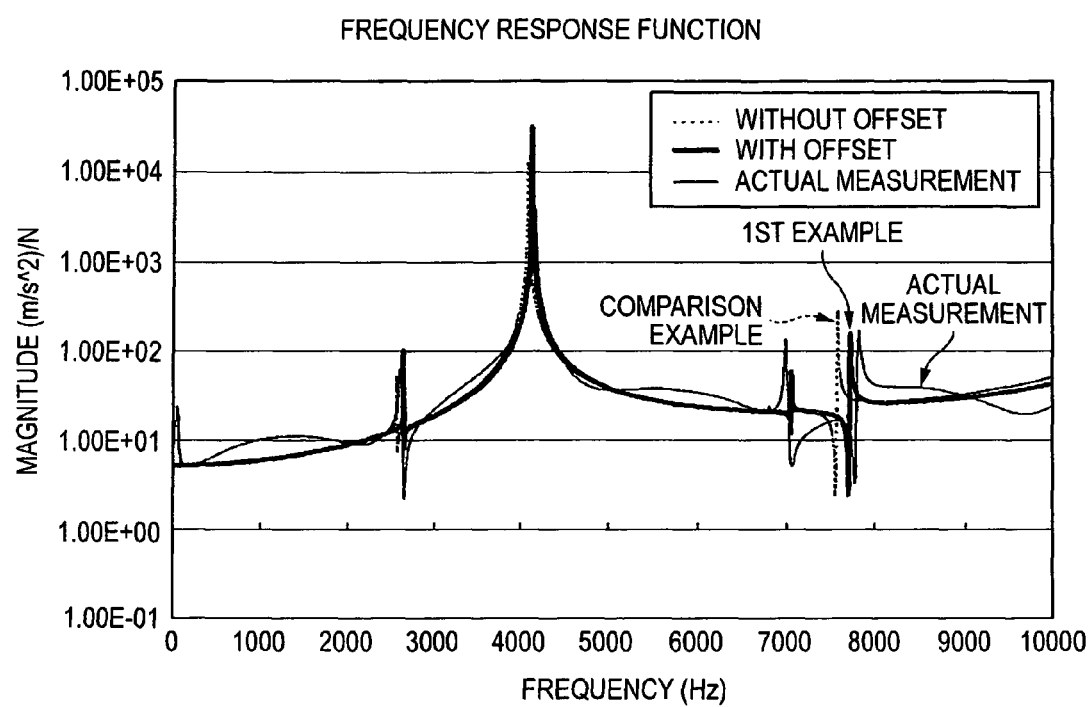
FIG. 3 shows a characteristic chart of a natural vibration analysis simulation of the plate model.
Figure 4:
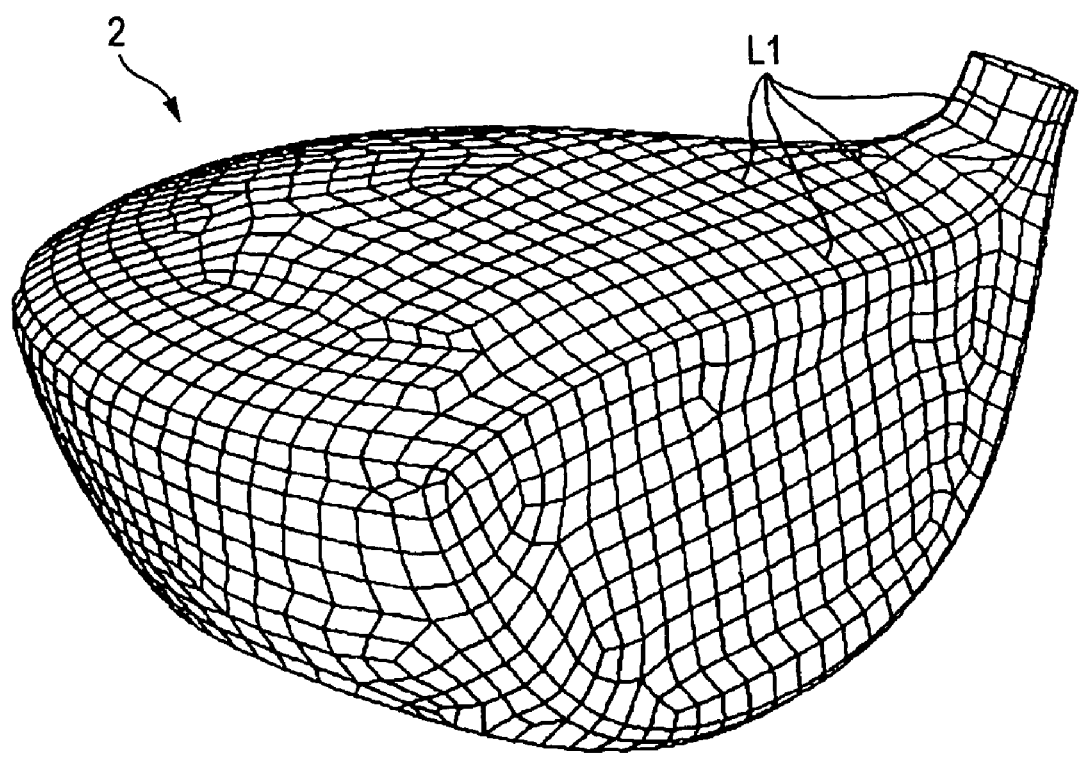
FIG. 4 is a perspective view of a wood model, which serves as the hitting side model.

Next, referring to FIGS. 2 to 4, an example where the shell elements of this embodiment are used as the finite element and a comparison example where the solid elements are used are compared and described specifically.

First Example

FIGS. 2 and 3

In a first example, this embodiment of the invention is applied to a case where a plate model having, as shown in FIG. 2, a circular shape on a front side is used as a hitting model.

This plate model 1 is assumed to be used for a hitting surface of a golf club head. Mesh portions, which are divided up by innumerable fine dividing lines L, L in FIG. 2, are units of models to which the shell elements are applied. Then, the plate model 1 is divided into five annular areas from a central portion toward an outside thereof as shown by thick annular boundary lines D1 to D4. The plate model 1 is formed so that the thickness increases from the central portion to the outside thereof.

1) Number of Mesh Elements (Number of Finite Elements)

When the plate model 1 that is formed as has been described above was divided into models using four-node shell elements according to the method of this embodiment, the number of mesh elements (the number of finite elements) was 1,600. In this case, vector directions of the shell elements, which were applied to the respective mesh elements, were identical to each other. Shapes of the respective models (mesh elements) to which the shell elements were applied were identical to the counter shape of the plate model 1, which constitutes a shape to be required. The expression "the vector directions of the shell (surface) elements are identical to each other" means that the vectors of the shell elements have the same direction (either toward outside of the surfaces or toward inside of the surfaces). In the case where thickness of the shell (surface) elements are defined, if the vector directions of the shell elements are not aligned, thickness of ones of the shell elements is defined outward while that of the others of the shell elements is defined inward. As a result, such an inconsistency generates an inappropriate model.

On the other hand, when the plate model 1 was divided into models using the solid elements in the comparison example, the number of mesh elements (the number of finite elements) was 7,200.

Consequently, since the number of mesh elements of this example is less than that of the comparison example, the calculation time can be reduced.

2) Impact Analysis Simulation
Analysis Conditions

The plate model 1 was moved at a speed of 45 m/s and was brought to collide with a ball model with a loft angle of 0 degree, that is, at right angles. The number of meshes of the ball model was 3,400, and each mesh was made of a solid mesh of a hexahedron. A state of impact from the start of impact to 0.0002 seconds (2 ms) thereafter or a post-impact state was calculated using a general purpose computer (PRECISION 340 MODEL from DELL Co., Ltd.) on which the aforesaid calculation software (LS-DYNA) ran.

Results of Analysis

Calculation times were obtained, respectively, in the example where the shell elements of this embodiment were used according to the analysis conditions and the comparison example where the solid elements are used. The example where the shell elements of this embodiment were used took 780 seconds, which was about one fifth of 3,902 seconds that the comparison example where the solid elements were used took. Accordingly, it was found that the reduction in calculation time could be realized by the method according to this embodiment.

3) Natural Vibration Analysis Simulation
Analysis Conditions

With respect to this example where the shell elements were offset and a comparison example where the shell elements were not offset, vibration frequencies at a peripheral portion of the plate model 1 when vibrations were applied to a center point of the plate model 1 as a vibration applying point were calculated with running the calculation software (ABAQUS) on the respective computers. Furthermore, actual measurements were carried out under the same conditions.

Results of Analysis

The results of the analysis are shown in FIG. 3. The results of the actual measurements are drawn by a thin solid line in FIG. 3, the results of the calculation made on this example where the shell elements were offset are drawn by a thick solid line in FIG. 3 and the results of the calculation made on the comparison example where the shell elements were not offset are drawn by a broken line in FIG. 3. It is seen from FIG. 3 that the resulting curve of this example are substantially similar to the actually measured values, whereas along the resulting curve of the comparison example, there is a point where the result of the comparison example deviates largely from the actually measured value (in the vicinity of 7,500 Hz). Consequently, it is found that this embodiment where the shell elements are offset can perform a more highly accurate simulation can be effected with the shell elements than the comparison examples.

Second Example

FIG. 4

As shown in FIG. 4, a second example is applied to a wood model 2, which is the hitting side model.

In this wood model 2, mesh portions divided up by innumerable fine dividing lines L1, L1 shown in FIG. 4 are units of models to which shell elements are applied.

1) Number of Mesh Elements (Number of Finite Elements)

When the wood model 2 that is formed as has been described above was divided into models using four-node shell elements based on the method of this embodiment, the number of mesh elements (the number of finite elements) was 1,624. In this case, vector directions of the shell elements, which were applied to the respective mesh elements, were identical to each other. Shapes of the respective models (mesh elements) to which the shell elements were applied were identical to the counter shape of the wood model 2, which constitutes a shape to be required.

On the other hand, when the wood model 2 was divided into models using the solid elements (which were a comparison example), the number of mesh elements (the number of finite elements) was 3,580.

Consequently, since the number of mesh elements of this example is less than that of the comparison example, the calculation time can be reduced.

2) Impact Analysis Simulation

Analysis Conditions

The wood model 2 was moved at a speed of 45 m/s and was brought to collide with a ball model with a loft angle of 0 degree, that is, at right angles. The number of meshes of the ball model was 3,400, and each mesh was made of a solid mesh of a hexahedron. A state of impact from the start of impact to 0.0002 seconds (2 ms) thereafter or a post-impact state was calculated using a general purpose computer (PRECISION 340 MODEL from DELL Co., Ltd.) on which the aforesaid calculation software (LS-DYNA) ran.

Results of Analysis

Calculation times were obtained, respectively, in the example where the shell elements of this embodiment were used according to the analysis conditions and the comparison example where the solid elements are used. The second example where the shell elements of this embodiment were used took 503 seconds, which was about one half of 1,100 seconds that the comparison example where the solid elements were used took. Accordingly, it was found that the reduction in calculation time could be realized by the method according to this embodiment.

3) Natural Vibration Analysis Simulation

Analysis Conditions

With respect to the second example where the shell elements were offset and a comparison example where the shell elements were not offset, vibration frequencies at a peripheral portion of the wood model 2 when vibrations were applied to a center point of the wood model 2 as a vibration applying point were calculated with running the calculation software (ABAQUS) on the respective computers. Furthermore, actual measurements were carried out under the same conditions.

Results of Analysis

According to the analysis results of a primary mode, the actual measurement showed 4,225 Hz, the results of the calculation made on the second example where the shell elements were offset according to the method of this embodiment showed 4,351 Hz and the results of the calculation made on the comparison example where the shell elements were not offset showed 4,559 Hz. Consequently, it is found that this embodiment where the shell elements are offset can perform a more highly accurate simulation can be effected with the shell elements than the comparison examples.

While a number of exemplary aspect and embodiments have been discussed above, those of skill in the art will recognize certain modifications, permutations, additions and sub-combinations thereof. It is therefore intended that the following appended claims and claims hereinafter introduced are interpreted to include all such modifications, permutations, additions and sub-combinations as are within the true spirit and scope.

What is claimed is:

1. A method for simulating performance of a golf club head, the method comprising:
   dividing a model of the golf club head of a hollow structure using shell elements as finite elements;
   arranging the shell elements so that a surface of the shell elements overlaps with a surface of the model of the golf club head;
   a computer performing a simulation using the model of the golf club head using a processor; and
   the computer outputting results of the simulation,
   wherein vector directions of the shell elements are identical to each other.

2. The method according to claim 1, wherein:
   the dividing of the golf club head comprises:
   applying four-node shell elements to most parts of the model; and
   applying to the remaining parts of the model at least one selected from a group consisting of three-node shell elements, the four-node solid elements, eight-node solid elements, beam elements and concentrated mass elements.

3. The method according to claim 2, wherein a thickness of the model of the golf club head is defined.

4. The method according to claim 2, wherein material conditions of the model of the golf club head are defined.

5. The method according to claim 4, wherein at least one of density, Young's modulus, or a Poisson ratio of the model of the golf club head is defined.

6. The method according to claim 1, wherein a shape of the model to which the shell elements are applied is identical to a contour shape of an object to be obtained.

7. The method according to claim 1, wherein the simulation is an impact analysis simulation or a natural vibration analysis simulation.

8. The method according to claim 1, wherein a thickness of the model of the golf club head is defined.

9. The method according to claim 1, wherein material conditions of the model of the golf club head are defined.

10. The method according to claim 9, wherein at least one of density, Young's modulus, or a Poisson ratio of the model of the golf club head is defined.

11. The method according to claim 1, wherein the model of the golf club comprises a hollow geometric shape having walls of varying thickness.

12. The method according to claim 1, wherein the model of the golf club comprises a hollow geometric shape having walls of varying thickness.

13. The method according to claim 1, wherein the shell elements are not arranged on a neutral plane of a wall of the model of the golf club head.

14. The method according to claim 1, further comprising:
   inputting thickness and material properties of a golf club,
   wherein computer simulation includes at least one of an impact analysis simulation and a natural vibration analysis simulation, between the golf club head and a golf ball.

15. A method for simulating performance of a golf club head, the method comprising:
   dividing a model of the golf club head of a hollow structure using shell elements as finite elements;

arranging the shell elements on a surface of the model of the golf club head;
a computer performing a simulation using the model of the golf club head using a processor; and
the computer outputting results of the simulation,
wherein the dividing of the golf club head comprises:
   applying four-node shell elements to most parts of the model; and
   applying to the remaining parts of the model at least one selected from a group consisting of three-node shell elements, four-node solid elements, eight-node solid elements, beam elements, and concentrated mass elements.

16. The method according to claim 15, wherein a thickness of the model of the golf club head is defined.

17. The method according to claim 15, wherein material conditions of the model of the golf club head are defined.

18. The method according to claim 17, wherein at least one of density, Young's modulus, or a Poisson ratio of the model of the golf club head is defined.

19. The method according to claim 15, wherein the shell elements are not arranged on a neutral plane of a wall of the model of the golf club head.

20. The method according to claim 15, further comprising: inputting thickness and material properties of a golf club, wherein computer simulation includes at least one of an impact analysis simulation and a natural vibration analysis simulation, between the golf club head and a golf ball.

* * * * *